United States Patent
Lee et al.

(10) Patent No.: US 7,897,499 B2
(45) Date of Patent: Mar. 1, 2011

(54) METHOD FOR FABRICATING A SEMICONDUCTOR DEVICE WITH SELF-ALIGNED CONTACT

(75) Inventors: Min-Suk Lee, Ichon-shi (KR); Jae-Young Lee, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 356 days.

(21) Appl. No.: 11/646,473

(22) Filed: Dec. 28, 2006

(65) Prior Publication Data
US 2007/0202691 A1    Aug. 30, 2007

(30) Foreign Application Priority Data

Feb. 24, 2006  (KR) .................. 10-2006-0018333
Dec. 8, 2006   (KR) .................. 10-2006-0124739

(51) Int. Cl.
*H01L 21/3205* (2006.01)

(52) U.S. Cl. ............... 438/586; 438/128; 438/129; 438/630; 438/633; 438/634; 257/208; 257/211; 257/775

(58) Field of Classification Search ......... 438/723, 438/39, 700, 706, 710, 711, 714, 637, 128, 438/129, 630, 633, 634, 14, 240, 253, 784; 257/208, 211, 775
See application file for complete search history.

(56) References Cited

U.S. PATENT DOCUMENTS

| | | | | |
|---|---|---|---|---|
| 5,863,820 A | * | 1/1999 | Huang | 438/241 |
| 6,303,496 B1 | * | 10/2001 | Yu | 438/668 |
| 6,808,975 B2 | * | 10/2004 | Song et al. | 438/233 |
| 6,867,145 B2 | * | 3/2005 | Lee et al. | 438/706 |
| 7,229,904 B2 | * | 6/2007 | Kim | 438/586 |
| 2003/0003712 A1 | * | 1/2003 | Kwon et al. | 438/630 |
| 2004/0123528 A1 | * | 7/2004 | Jung et al. | 51/309 |
| 2005/0064727 A1 | * | 3/2005 | Lee et al. | 438/781 |
| 2005/0090055 A1 | * | 4/2005 | Lee et al. | 438/256 |
| 2005/0090117 A1 | * | 4/2005 | Lee et al. | 438/706 |
| 2005/0142824 A1 | * | 6/2005 | Kim | 438/586 |
| 2005/0272245 A1 | * | 12/2005 | Choi et al. | 438/618 |
| 2006/0003571 A1 | | 1/2006 | Lee et al. | |
| 2006/0141696 A1 | * | 6/2006 | Choi et al. | 438/238 |
| 2007/0275555 A1 | * | 11/2007 | Kim | 438/637 |

FOREIGN PATENT DOCUMENTS

KR    2005-0038872    4/2005

OTHER PUBLICATIONS

Office Action issued from the Korean Patent Office on Nov. 15, 2007.
M.S. Lee et al., "Highly Manufacturable Landing Plug Contact Formation for 80nm Technology and Beyond," The 12$^{th}$ Korean Conference on Semiconductors, pp. 433-434 and partial Table of Contents (2005).

* cited by examiner

*Primary Examiner*—William M Brewster
*Assistant Examiner*—Wilner Jean Baptiste
(74) *Attorney, Agent, or Firm*—IP & T Group LLP (57) ABSTRACT

A method for fabricating a semiconductor device includes forming electrode patterns over a substrate, wherein the electrode patterns include a hard mask, forming a passivation layer on the electrode patterns, forming an insulation layer on the passivation layer, filling a space between the electrode patterns, planarizing the insulation layer until shoulder portions of the hard mask are planarized, forming a mask pattern on a resultant structure, and etching a portion of the insulation layer to form a contact hole.

7 Claims, 13 Drawing Sheets

METHOD FOR FABRICATING A SEMICONDUCTOR DEVICE WITH SELF-ALIGNED CONTACT

RELATED APPLICATIONS

This application is based upon and claims the benefit of priority to Korean Application numbers 10-2006-0018333 and 10-2006-0124739, filed on Feb. 24, 2006, and Dec. 8, 2006, respectively, the entire contents of which are incorporated herein by reference.

BACKGROUND

The present invention relates to a method for fabricating a semiconductor device, and more particularly, to a method for fabricating a semiconductor device with a self-aligned contact (SAC).

In conventional semiconductor device fabrication processes, various attempts have been made to overcome limitations associated with mask overlay and patterning. A SAC method is one example of such attempts. According to the SAC method, an upper part of an electrode (e.g., gate electrode) is protected with a nitride layer using a selectivity ratio between nitride and oxide, and an oxide-based inter-layer insulation layer is etched to form a contact.

In consideration of SAC process conditions, if sufficient amounts of polymers are produced over a nitride layer formed over an upper part of an electrode patterned in a line type, a profile of the nitride layer usually becomes normal after SAC etching. However, the upper part of the electrode pattern is generally rounded. Thus, an amount of polymer deposited over the upper edge portions (hereinafter "shoulder portions") of the electrode pattern is small, and nitride-based spacers formed on sidewalls of the electrode pattern physically conjoin with a hard mask of the electrode pattern. As a result, during SAC etching, the nitride layer formed over the upper part of the electrode pattern is damaged, resulting in a convex-concave profile.

Figure 1A:
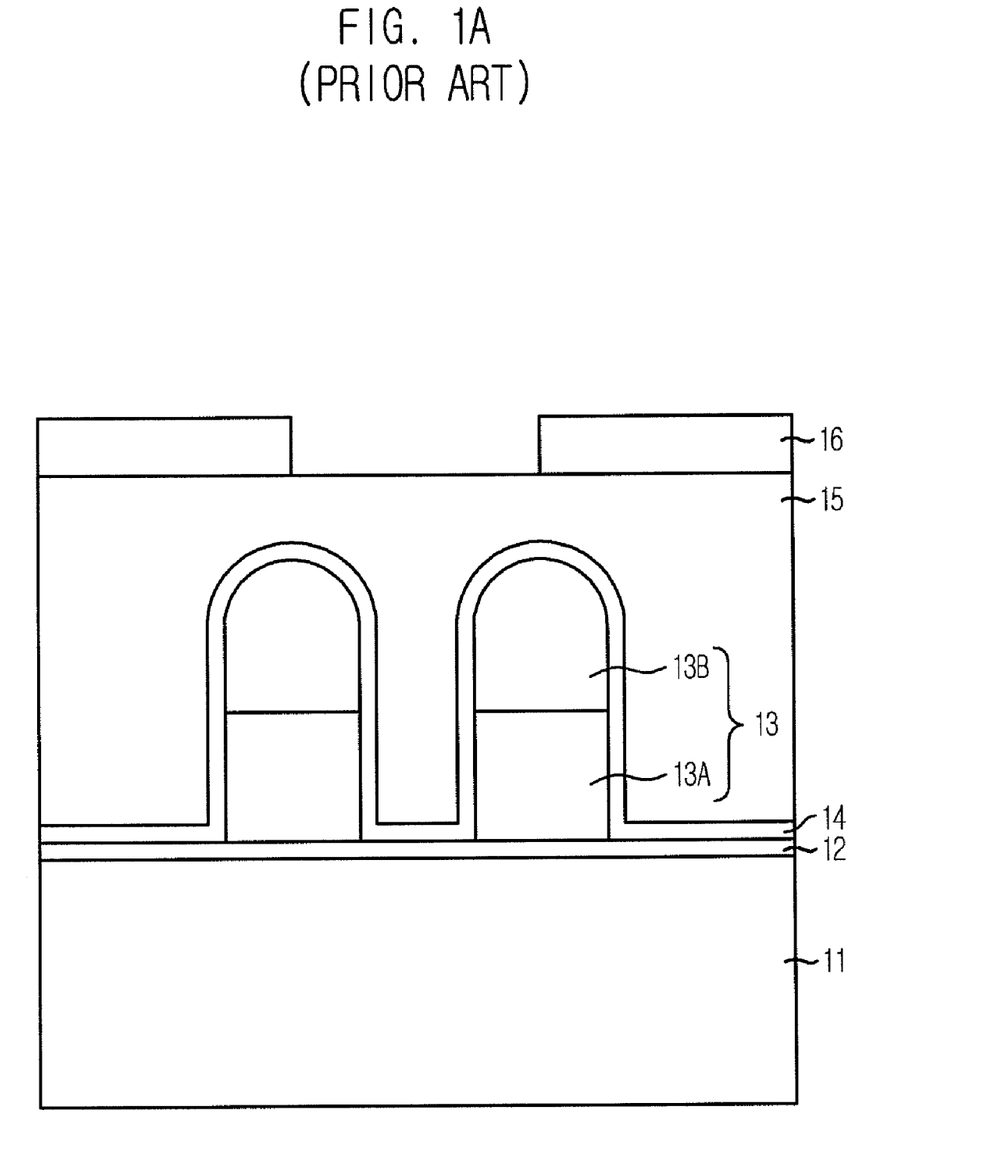
FIGS. 1A to 1C illustrate sectional views to describe a conventional method for fabricating a semiconductor device.
Figure 1B:
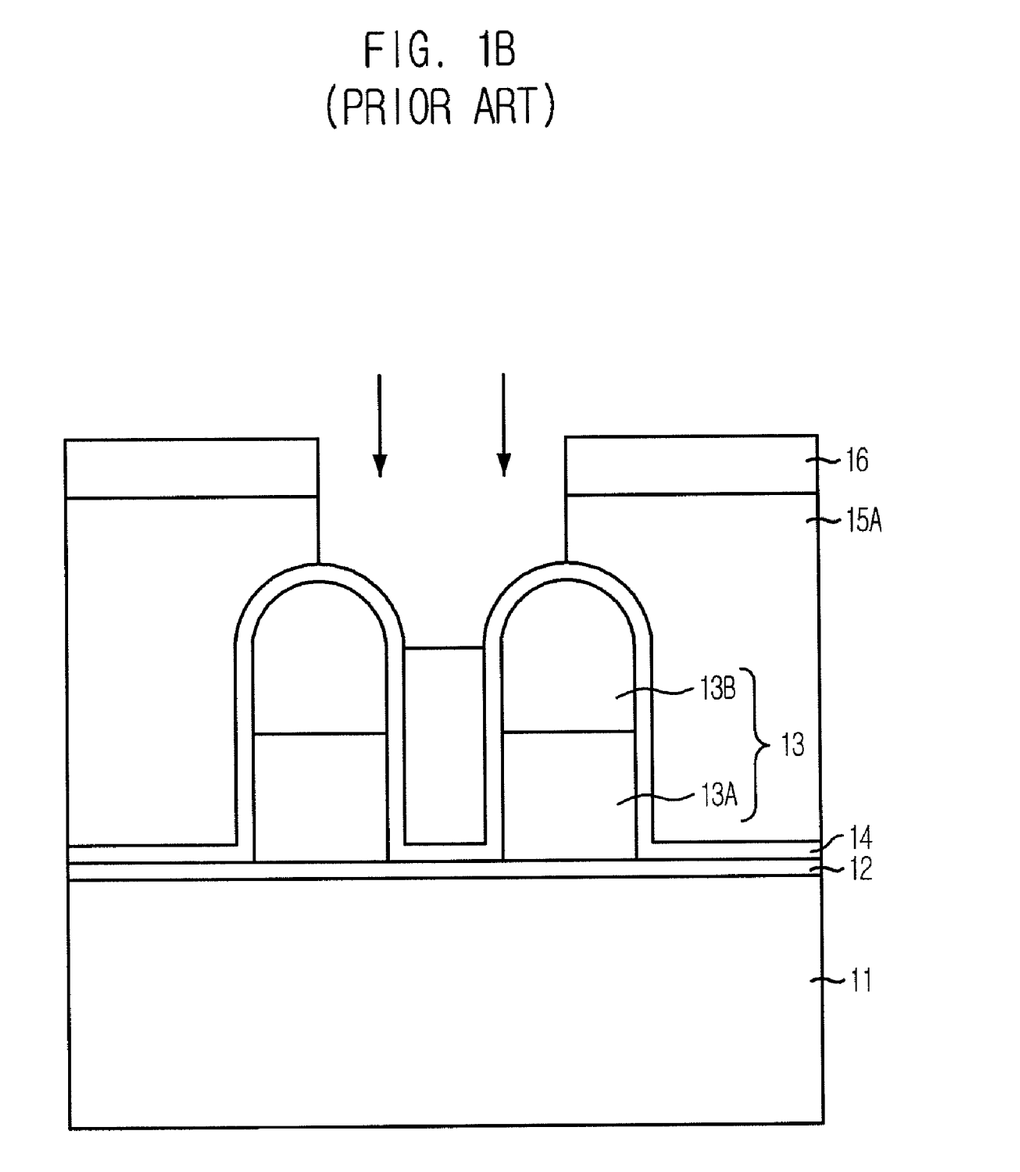
Figure 1C:
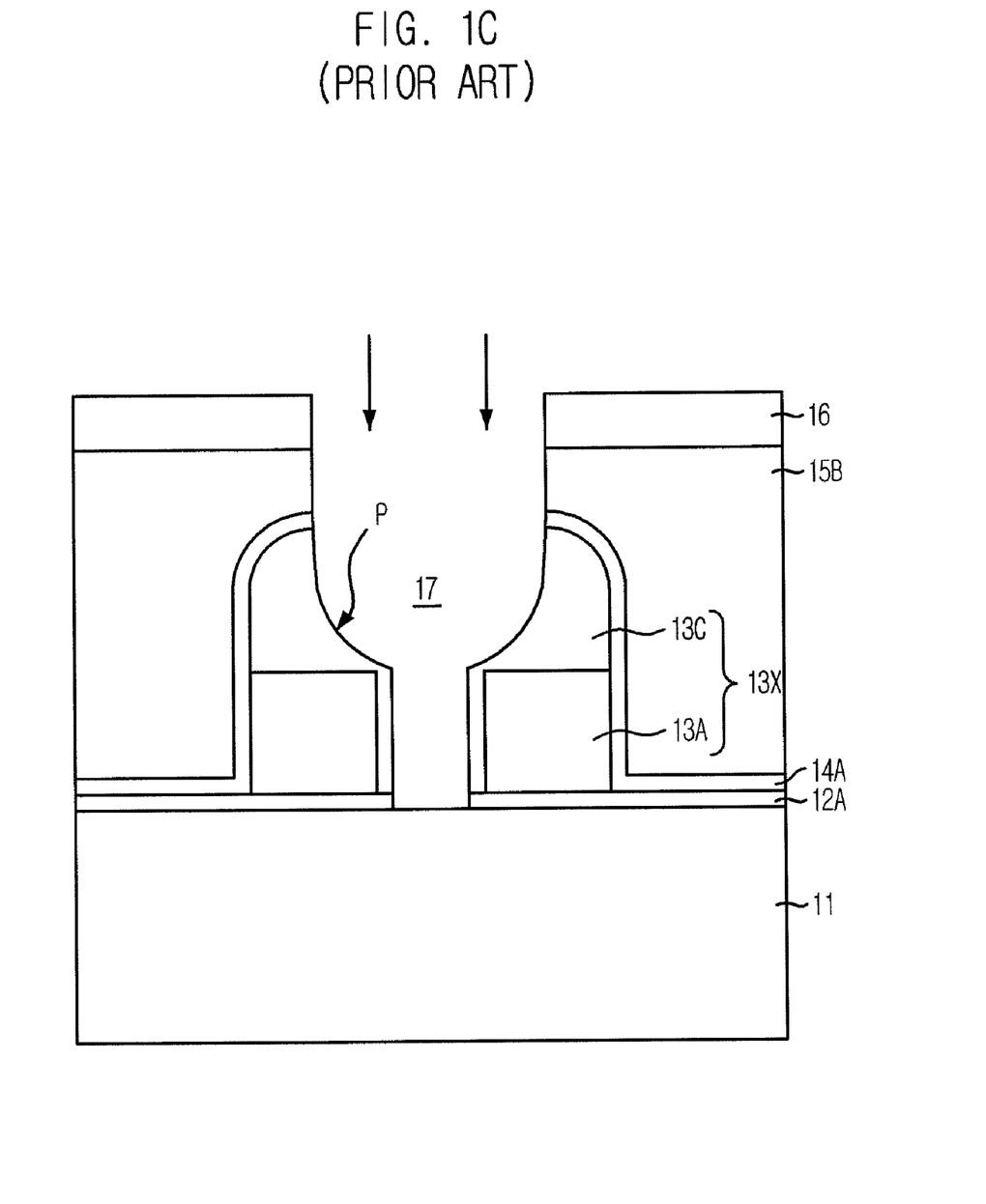
Figure 2A:
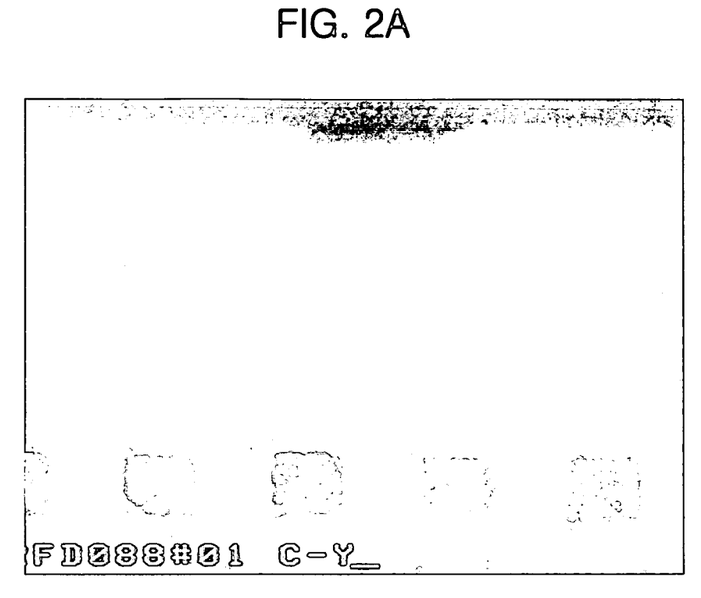
FIGS. 2A to 2C illustrate transmission electron microscopic (TEM) images of semiconductor structures fabricated by the conventional method described in FIGS. 1A to 1C.
Figure 2B:
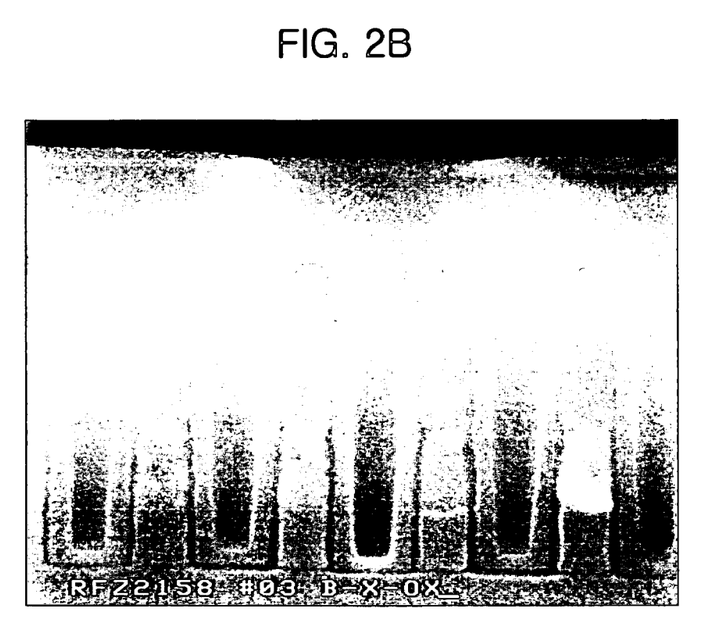
Figure 2C:
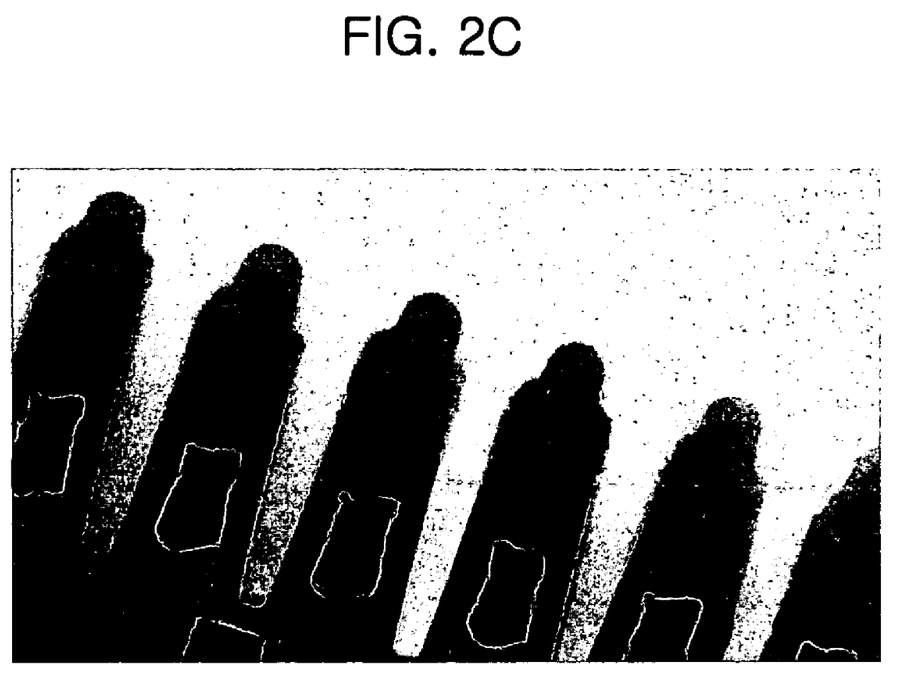

FIGS. 1A to 1C are sectional views to illustrate a conventional SAC process. FIGS. 2A to 2C are transmission electron microscopic (TEM) images of semiconductor structures obtained by the conventional SAC process. Referring to FIG. 1A, a gate insulation layer 12 is formed over a substrate 11, and a plurality of gate patterns 13 are formed thereon. Each of gate patterns 13 includes a gate electrode 13A and a gate hard mask 13B, which are sequentially formed in a stack structure.

A passivation layer 14 is formed over the above resultant structure. Passivation layer 14 protects gate patterns 13. An inter-layer insulation layer 15 is formed over passivation layer 14, filling the space between gate patterns 13. Inter-layer insulation layer 15 is formed of an oxide-based material. A contact mask pattern 16 is formed over a portion of inter-layer insulation layer 15 where a SAC region is to be formed. Contact mask pattern 16 is usually formed of a nitride-based material, and has an opening wider than the space between gate patterns 13.

Referring to FIGS. 1B and 1C, the SAC designated region of inter-layer insulation layer 15 is etched using contact mask pattern 16 as an etch mask to form a SAC hole 17. Reference numeral 15A illustrated in FIG. 1B represents a first patterned inter-layer insulation layer. Reference numerals 12A, 14A, and 15B, illustrated in FIG. 1C, respectively represent a patterned gate insulation layer, a patterned passivation layer, and a second patterned inter-layer insulation layer during the formation of SAC hole 17. Since shoulder portions of gate patterns 13 are rounded, polymers are less likely to be deposited over the shoulder portions during etching of inter-layer insulation layer 15 (i.e., SAC etching), and thus, gate hard masks 13B are more likely to be damaged. This damage is illustrated in FIG. 1C and labeled as "P." If gate hard masks 13B are severely damaged, a short failure may occur between each of gate electrodes 13A and a conductive material to fill SAC hole 17. Reference numerals 13C and 13X represents damaged gate hard masks and gate patterns during the SAC etching, respectively.

FIG. 2A illustrates a TEM image of a semiconductor structure obtained after sequential process steps illustrated in FIG. 1A. Gate patterns 13 have rounded upper parts. FIGS. 2B and 2C illustrate TEM images of semiconductor structures obtained after sequential process steps illustrated in FIGS. 1B and 1C, respectively.

Although SAC etching can be performed under the condition that produces lots of polymers to reduce damage to a gate hard mask, an inter-layer insulation layer between gate patterns may not be removed to a sufficient level. Accordingly, contact regions may not be opened properly.

BRIEF SUMMARY

Specific embodiments consistent with the present invention are directed to provide a method for fabricating a semiconductor device with a self-aligned contact, wherein the semiconductor device can prevent a short failure and a contact hole opening failure by reducing damage to a hard mask of an electrode.

In accordance with one aspect consistent with the present invention, there is provided a method for fabricating a semiconductor device. The method includes forming electrode patterns over a substrate, wherein the electrode patterns include a hard mask, forming a passivation layer on the electrode patterns, forming an insulation layer on the passivation layer, filling a space between the electrode patterns, planarizing the insulation layer until shoulder portions of the hard mask are planarized, forming a mask pattern on a resultant structure, and etching a portion of the insulation layer to form a contact hole.

In accordance with another aspect consistent with the present invention, there is provided a method for fabricating a semiconductor device. The method includes forming electrode patterns over a substrate, wherein the electrode patterns include a hard mask, forming a passivation layer on the electrode patterns, forming an insulation layer on the passivation layer, filling a space between the electrode patterns, forming a mask pattern over a certain region of the insulation layer, etching the insulation layer until shoulder portions of the hard mask are planarized, and etching a portion of the insulation layer to form a contact hole.

DESCRIPTION OF SPECIFIC EMBODIMENTS

A fabrication method of a semiconductor device according to various embodiments consistent with the present invention may be implemented to any semiconductor device required of a self-aligned contact (SAC). However, the embodiments consistent with the present invention are exemplified for forming a contact hole between gate patterns for the simplicity of description. In other words, although forming the contact hole between the gate patterns is described in the following embodiments consistent with the present invention, these embodiments consistent with the present invention can still be applied to a method for forming an opening between bit lines or between metal interconnections.

Figure 3A:
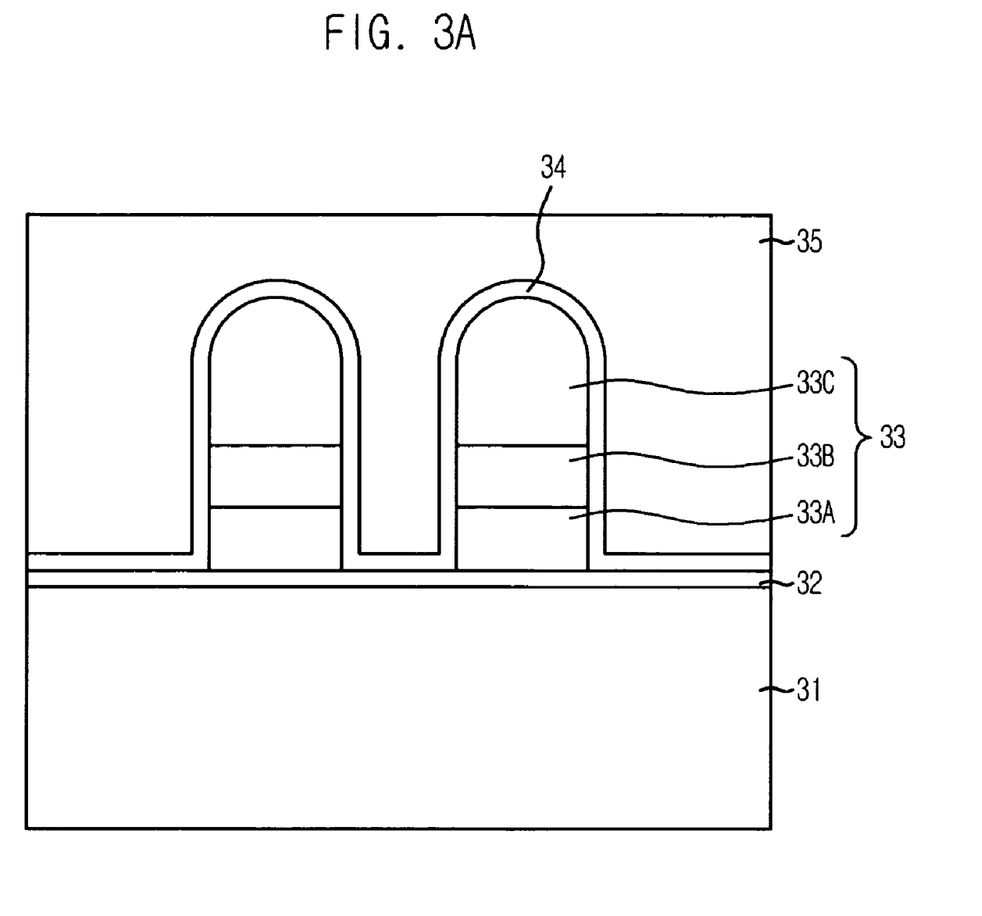
FIGS. 3A to 3C illustrate sectional views to describe a method for fabricating a semiconductor device in accordance with an embodiment consistent with the present invention.
Figure 3B:
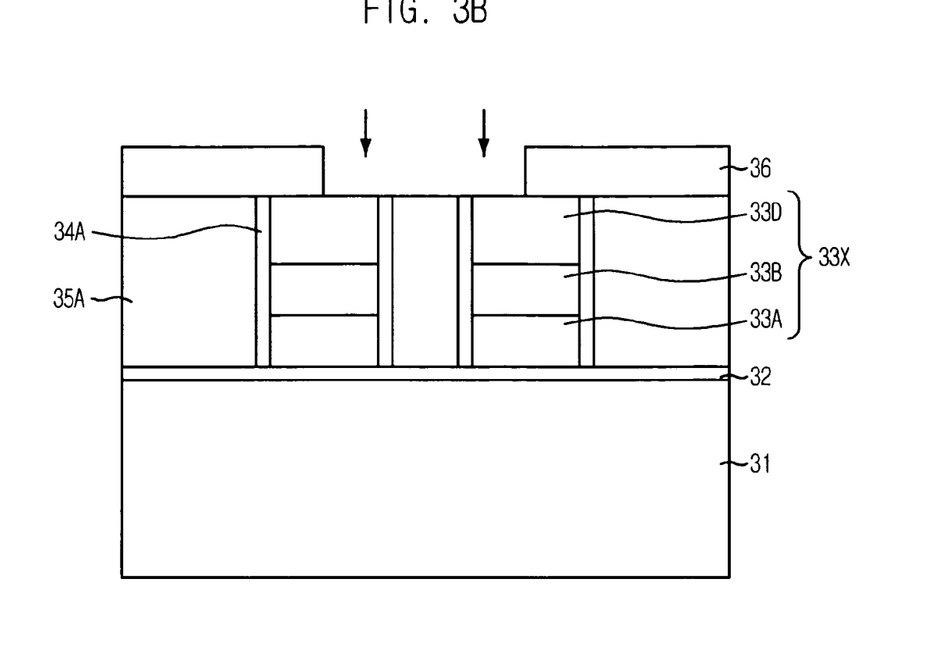
Figure 3C:
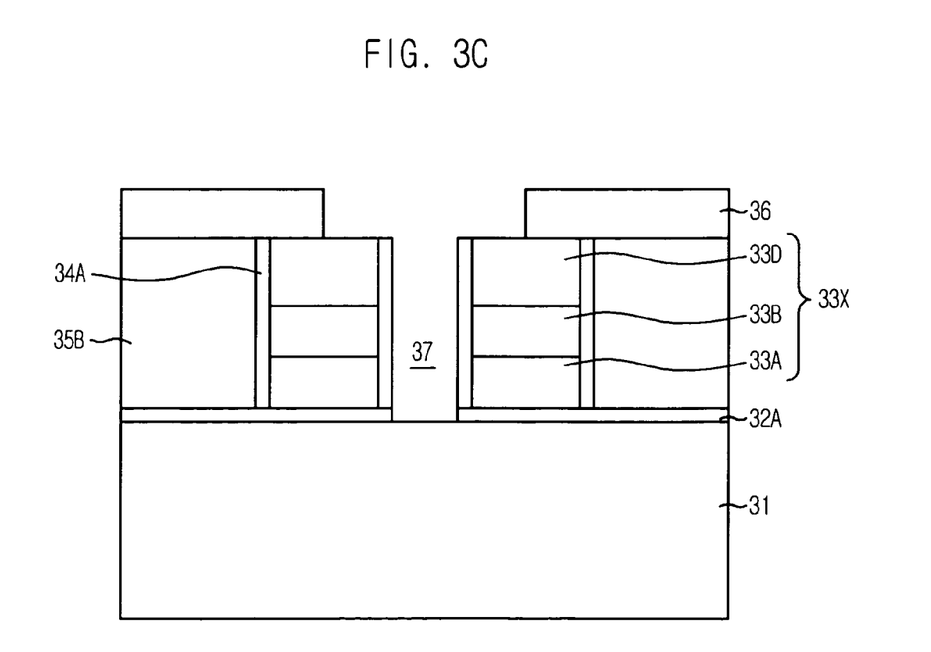

FIGS. 3A to 3C are sectional views illustrating a method for fabricating a semiconductor device in accordance with an embodiment consistent with the present invention. In particular, the method includes a SAC method. Referring to FIG. 3A, a gate insulation layer 32 is formed over a substrate 31. Although not illustrated, substrate 31 may include an isolation structure that defines an active region and wells. Gate insulation layer 32 may be formed from a material including an oxide-based material, a nitride-based material, or an oxynitride-based material.

Gate patterns 33 are formed over gate insulation layer 32. Each of gate patterns 33 includes a gate electrode including polysilicon layer 33A, a tungsten or tungsten silicide layer 33B, and a gate hard mask 33C, which are formed in a stack structure. Gate hard masks 33C include a material having etch selectivity to a subsequent inter-layer insulation layer. For instance, gate hard masks 33C include one selected from a group consisting of silicon nitride ($Si_3N_4$), silicon rich oxynitride (SiON), silicon oxynitride (SiON), and a combination thereof. Gate patterns 33 are formed in a line type and have fine line widths. After gate patterning, gate hard masks 33C, which are upper parts of gate patterns 33, have a rounded profile.

A passivation layer 34 is formed to a certain thickness over gate patterns 33 and gate insulation layer 32. Passivation layer 34 includes a material having etch selectivity to a subsequent insulation layer (e.g., interlayer). For instance, passivation layer 34 includes one selected from a group consisting of $Si_3N_4$, silicon rich oxynitride, SiON, and a combination thereof.

An insulation layer 35 is formed over passivation layer 34, filling the space between gate patterns 33. Insulation layer 35 includes an oxide-based material having etch selectivity to gate hard masks 33C and passivation layer 34. For instance, insulation layer 35 includes one selected from a group consisting of borophosphosilicate glass (BPSG), an oxide-based layer obtained by a high density plasma-chemical vapor deposition (HDP-CVD) method, spin-on-glass (SOG), and a combination thereof.

Referring to FIG. 3B, the resultant structure illustrated in FIG. 3A is planarized until the round profile of gate patterns 33 is removed (i.e., the upper parts of gate patterns 33). The planarization may be performed by a chemical mechanical polishing (CMP) process. During the CMP process, insulation layer 35, passivation layer 34 and gate hard masks 33C are polished. Reference numerals 33X, 33D, 34A and 35A represent planarized gate patterns, planarized gate hard masks, a planarized passivation layer and a planarized insulation layer, respectively. Since the main planarization target is gate hard masks 33C, a slurry having a high etch rate to gate hard masks 33C is used.

A contact mask pattern 36 for a SAC is formed over planarized insulation layer 35A and planarized gate patterns 33X. Contact mask pattern 36 includes one selected from a group consisting of a nitride-based material, polysilicon, a carbon-based polymer material, and a combination thereof. Contact mask pattern 36 is formed by forming a contact mask layer and applying photolithography thereon. In detail, although not illustrated, an anti-reflective coating layer (e.g., organic bottom anti-reflective coating layer) and a photoresist layer may be formed over the contact mask layer. The photoresist layer is patterned by performing photo-exposure and developing processes, and the contact mask layer is patterned using the photoresist pattern. Finally, the photoresist pattern is removed.

Referring to FIG. 3C, portions of planarized insulation layer 35A and planarized passivation layer 34A exposed by contact mask pattern 36 are etched. At this time, gate insulation layer 32 is also etched to expose a portion of substrate 31 where source and drain junctions of a transistor are to be formed. As a result, a SAC hole 37 is formed. Reference numerals 32A and 35B represent a patterned gate insulation layer and a patterned insulation layer, respectively.

During this etching (i.e., SAC etching), since the profile of gate hard masks 33C are previously planarized, polymers are deposited over shoulder portions of planarized gate hard masks 33D. Hence, damage to planarized gate hard masks 33D can be reduced. Therefore, it is possible to prevent a short failure usually occurring between a conductive material to fill SAC hole 37 and the gate electrodes, each including polysilicon layer 33A and tungsten or tungsten silicide layer 33B. Since the SAC etching is not necessarily performed under a condition which produces lots of polymers, the formation of an improper contact opening may be prevented.

Figure 4A:
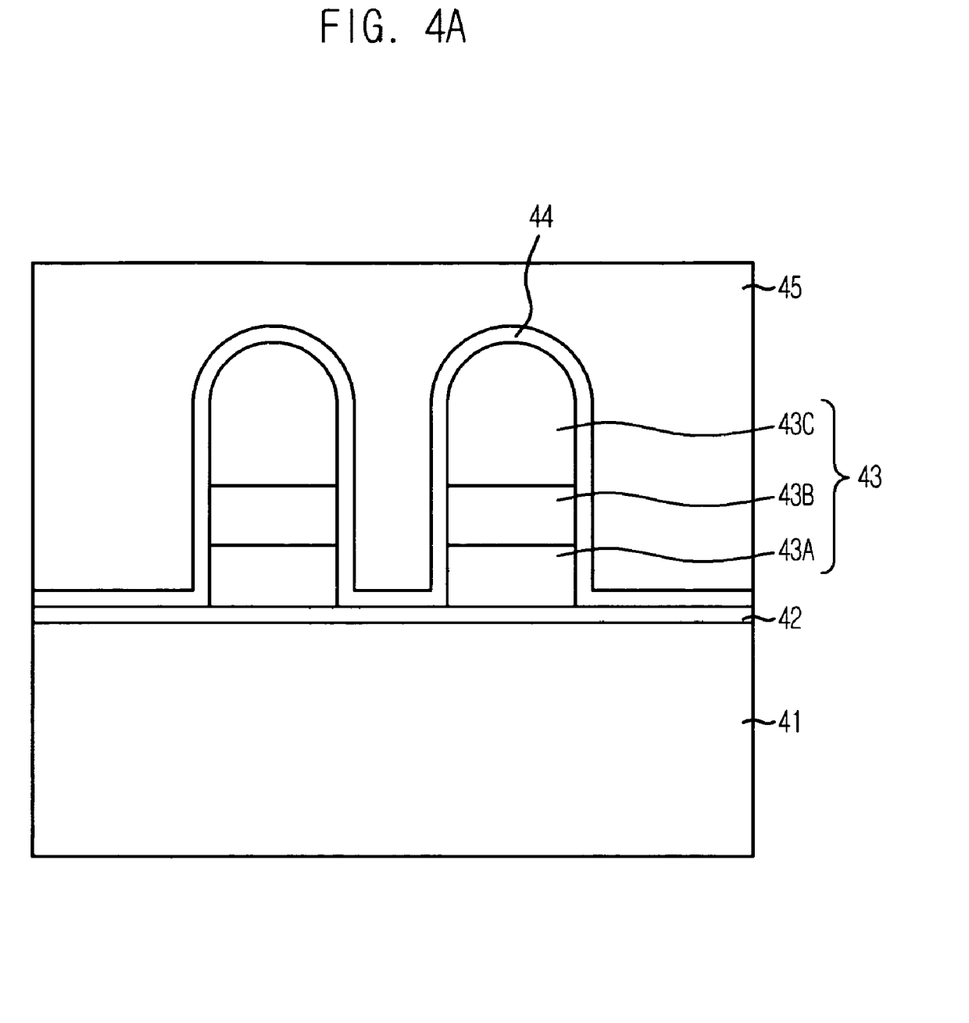
FIGS. 4A to 4C illustrate sectional views to describe a method for fabricating a semiconductor device in accordance with another embodiment consistent with the present invention.
Figure 4B:
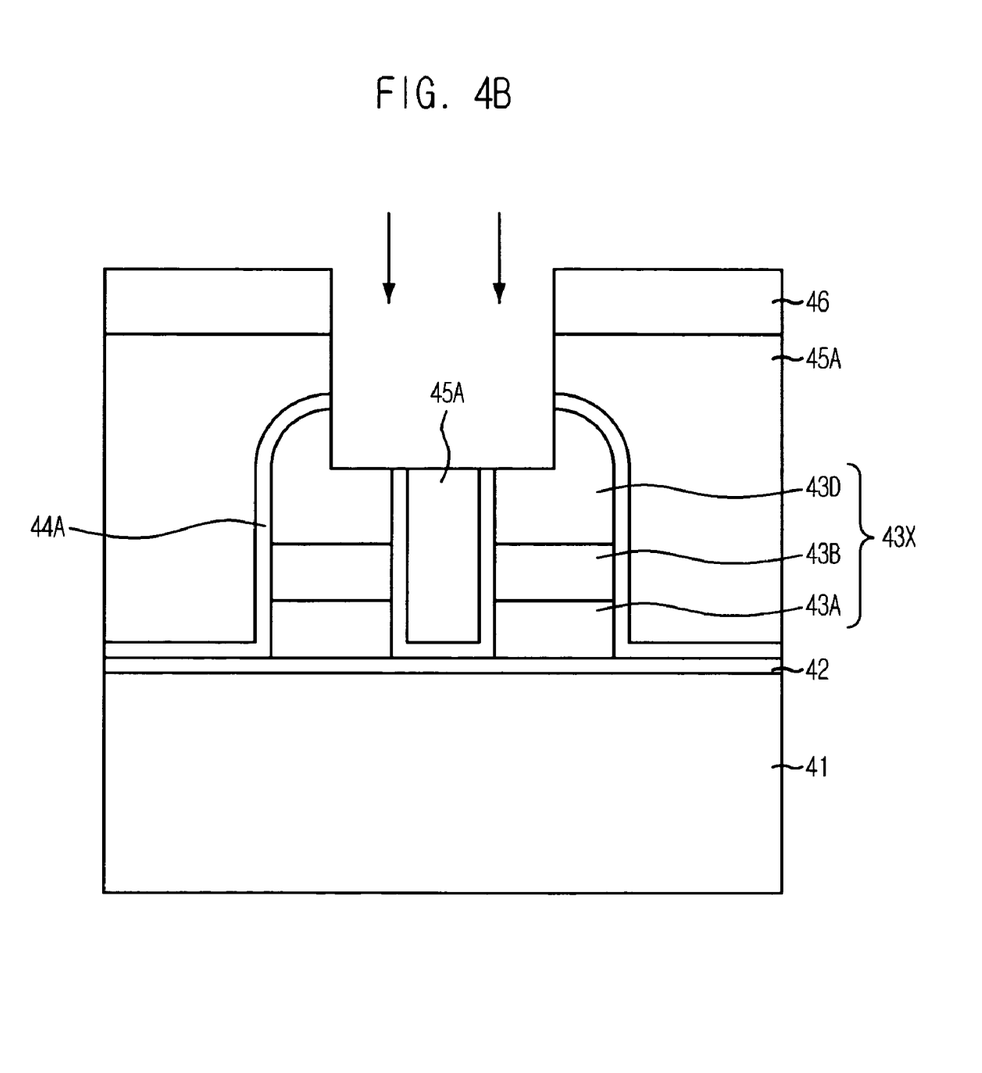
Figure 4C:
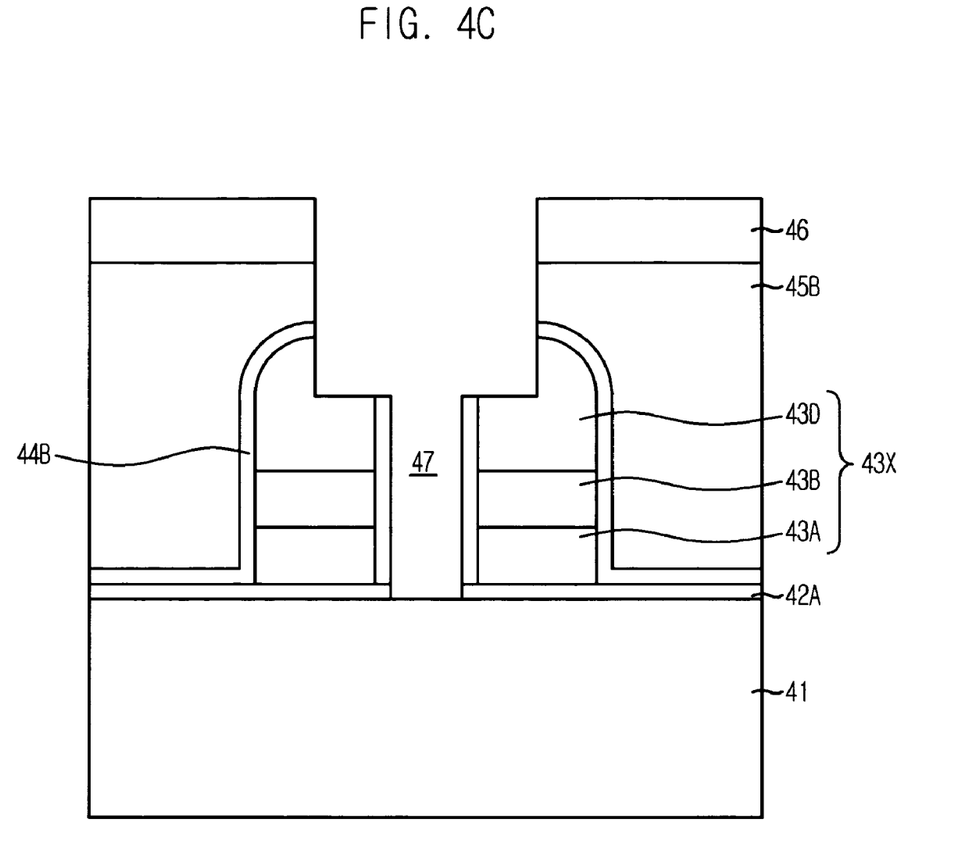

FIGS. 4A to 4C are sectional views illustrating a method for fabricating a semiconductor device in accordance with another embodiment consistent with the present invention. In particular, the method includes a SAC method. Referring to FIG. 4A, a gate insulation layer 42 is formed over a substrate 41. Although not illustrated, substrate 41 may include an isolation structure defining an active region and wells. Gate insulation layer 42 includes an oxide-based material, a nitride-based material, and an oxynitride-based material.

Gate patterns 43 are formed over gate insulation layer 42. Each of gate patterns 43 includes a gate electrode including a polysilicon layer 43A, a tungsten or tungsten silicide layer 42B, and a gate hard mask 43C, which are formed in a stack structure. Gate hard masks 43C include a material having etch selectivity to a subsequent insulation layer (e.g., interlayer). For instance, gate hard masks 43C include one selected form a group consisting of $Si_3N_4$, silicon rich oxynitride, SiON, and a combination thereof. Since gate patterns 43 are formed in a line type and have fine line widths, gate hard masks 43C, which are upper parts of gate patterns 43, have a round profile after gate patterning.

A passivation layer 44 is formed over gate patterns 43 and gate insulation layer 42. Passivation layer 44 includes a material having etch selectivity to the insulation layer. For example, passivation layer 44 includes a material selected form a group consisting of Si₃N₄, silicon rich oxynitride, SiON, and a combination thereof.

Insulation layer 45 is formed over the above resultant structure, filling the space between gate patterns 43. Insulation layer 45 includes an oxide-based material having etch selectivity to gate hard masks 43C and passivation layer 44. For instance, insulation layer 45 includes a material selected from a group consisting of BPSG, an oxide layer obtained by a HDP-CVD method, SOG, and a combination thereof.

Referring to FIG. 4B, a contact mask pattern 46 for a SAC is formed over insulation layer 45. Contact mask pattern 46 includes a nitride-based material, polysilicon, a carbon-based polymer material, or a combination thereof. Similar to the first described embodiment, contact mask pattern 46 is formed by depositing a contact mask layer and applying photolithography to the contact mask layer. Portions of insulation layer 45, passivation layer 44 and gate hard masks 43C exposed by contact mask pattern 46 are etched such that shoulder portions of gate hard masks 43C are partially planarized. This etching may be performed by employing a dry etching process or a wet etching process. Partially planarized gate hard masks and gate patterns are labeled as 43D and 43X, respectively. Also, reference numerals 44A and 45A represent a patterned insulation layer and a patterned passivation layer, respectively. Due to planarized gate hard masks 43D, polymers are deposited over the planarized surface of gate hard masks 43D during subsequent SAC etching, so that an additional loss of partially planarized gate hard masks 43D can be prevented.

Referring to FIG. 4C, portions of patterned insulation layer 45A and patterned passivation layer 44A disposed between partially planarized gate patterns 43X are etched. At this time, gate insulation layer 42 is also etched to form a SAC hole 47. SAC hole 47 exposes a portion of substrate 41 (e.g., source and drain junctions of a transistor). Reference numeral 42A denotes a patterned gate insulation layer.

Figure 5A:
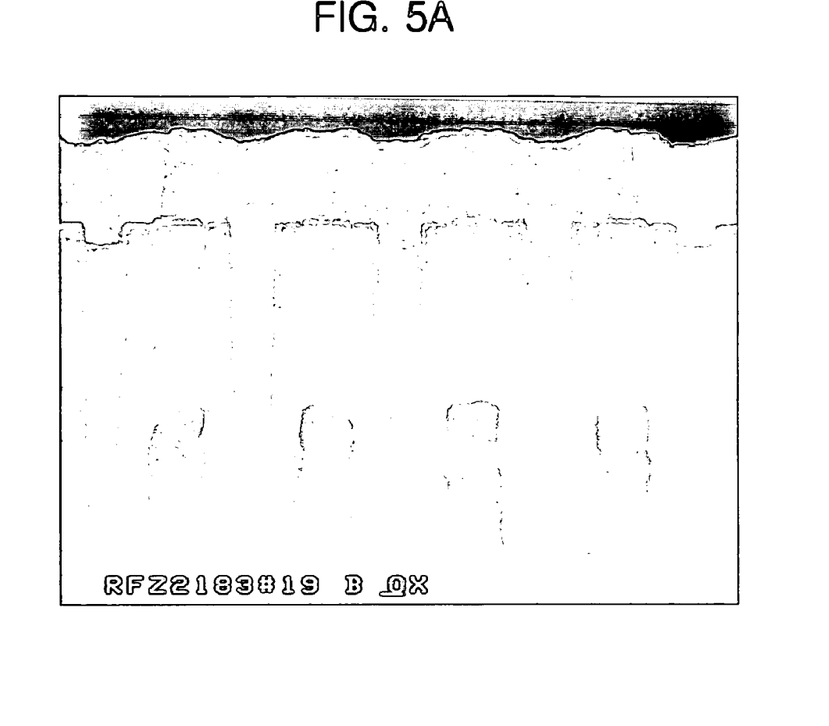
FIGS. 5A to 5C illustrate TEM images of semiconductor structures obtained by a fabrication method of a semiconductor device in accordance with another embodiment consistent with the present invention.
Figure 5B:
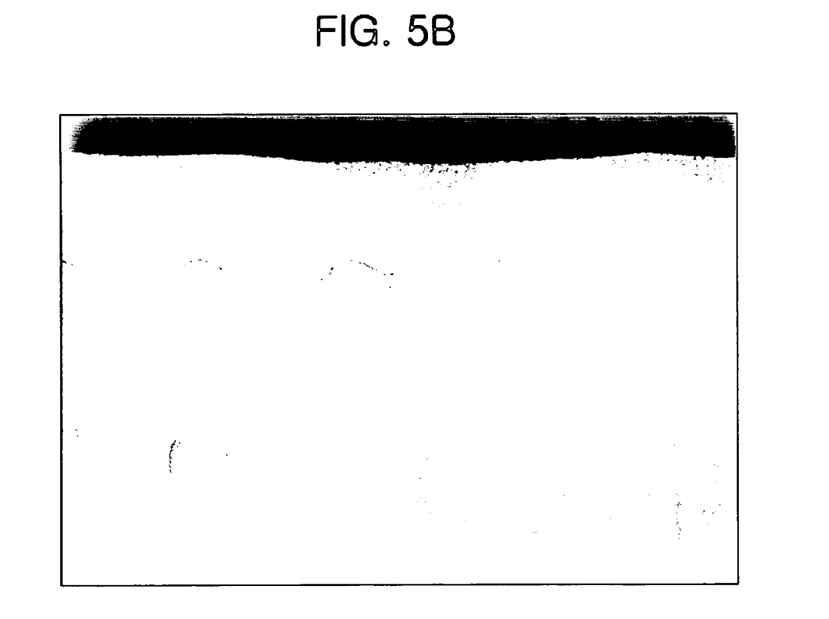
Figure 5C:
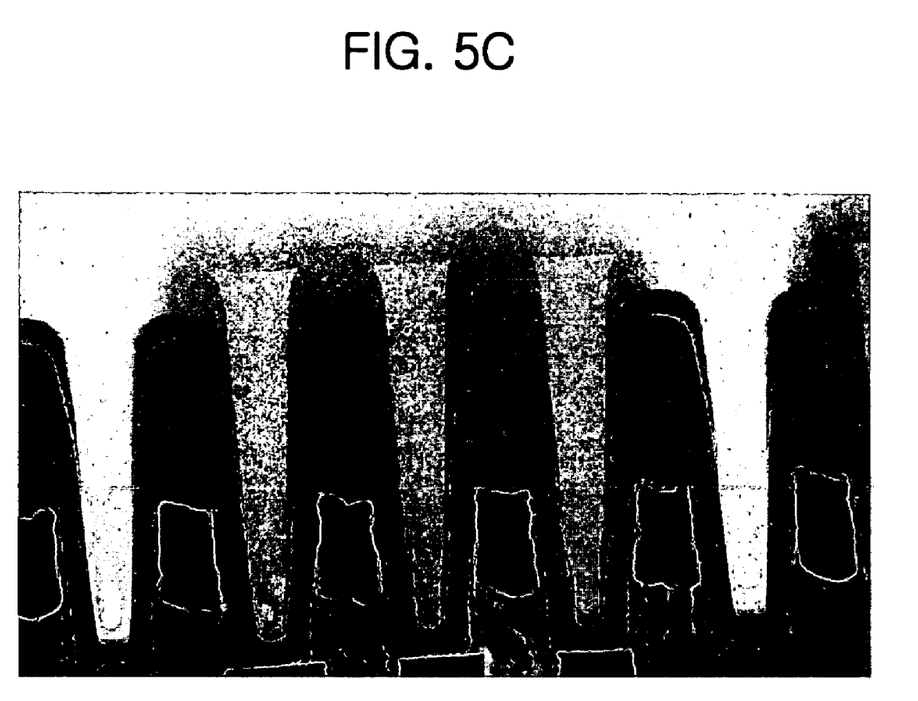

FIGS. 5A to 5C illustrate TEM images of semiconductor structures obtained by a fabrication method of a semiconductor device in accordance with another embodiment consistent with the present invention. FIG. 5A illustrates gate patterns with upper parts which are planarized by dry etching. Such a planarized profile of the gate patterns allows sufficient deposition of polymers over the gate patterns during subsequent SAC etching. As a result, damage to the upper parts of the gate patterns can be reduced.

FIGS. 5B and 5C illustrate profiles of gate patterns after SAC etching. As compared with profiles of the conventional gate patterns illustrated in FIG. 2B or 2C, the gate patterns illustrated in FIGS. 5B and 5C have upper parts which are less damaged.

Figure 6A:
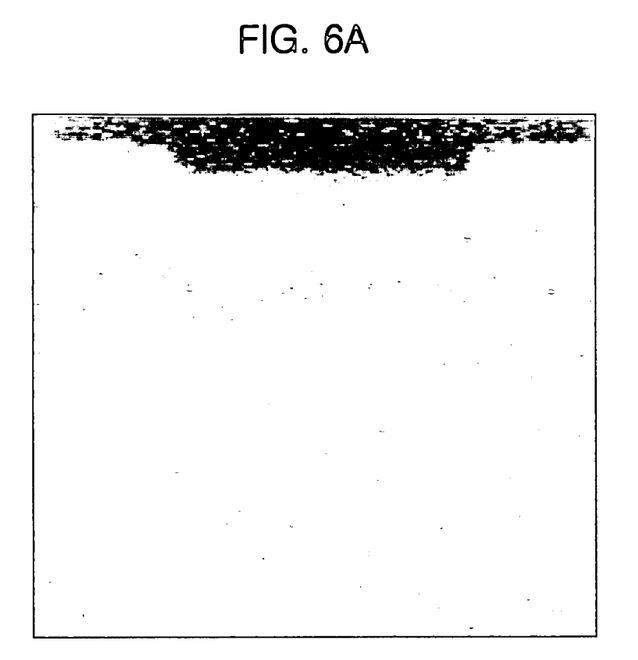
FIGS. 6A and 6B illustrate comparative TEM images of semiconductor devices, which are respectively fabricated by the conventional fabrication method and the fabrication method according to another embodiment consistent with the present invention.
Figure 6B:
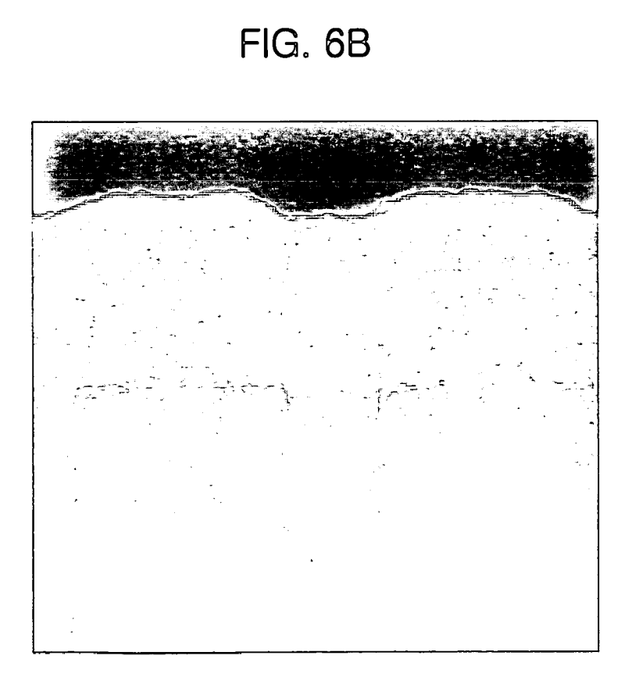

FIGS. 6A and 6B illustrate comparative TEM images of semiconductor devices, which are respectively fabricated by the conventional fabrication method and the fabrication method according to another embodiment consistent with the present invention. Referring to FIG. 6A, upper parts of the conventional gate patterns are rounded. On the other hand, as illustrated in FIG. 6B, upper parts of gate patterns formed according to the present embodiment are planarized. As compared with the round profile of the gate patterns illustrated in FIG. 6A, the planarized profile of the gate patterns illustrated in FIG. 6B allows deposition of polymers over the planarized surface of the gate patterns during SAC etching. The deposited polymers function as a protector, which can contribute to reduction in the loss of the gate hard masks.

On the basis of various embodiments consistent with the present invention, prior to SAC etching, the rounded upper parts of the gate patterns are planarized using one of CMP, dry etching, and wet etching. Thus, damage to the gate hard masks can be reduced during the SAC etching. Due to this effect, a short failure usually occurring between a contact material to fill the SAC hole and the individual gate electrodes can be prevented. It is unnecessary to perform the SAC etching under the condition that produces lots of polymers, and thus, an improper contact opening can be reduced.

It will be apparent to those skilled in the art that various changes and modifications may be made without departing from the spirit and scope consistent with the invention as defined in the following claims.

What is claimed is:

1. A method for fabricating a semiconductor device, comprising:
    forming a plurality of line type-electrode patterns having fine line widths over a substrate, wherein each of the electrode patterns includes a hard mask having a rounded upper portion;
    forming a passivation layer on the electrode patterns and the substrate;
    forming an insulation layer over the passivation layer, filling a space between the electrode patterns;
    planarizing the insulation layer until the rounded upper portion of the hard mask is partially planarized;
    forming a mask pattern on a planarized insulation layer; and
    etching a portion of the insulation layer to form a contact hole.

2. The method according to claim 1, wherein the electrode patterns further include gate patterns or bit line patterns.

3. The method according to claim 1, wherein the insulation layer includes an oxide-based material; and the hard mask of the electrode patterns and the passivation layer include a nitride-based material.

4. The method according to claim 1, wherein the insulation layer includes one selected from a group consisting of borophosphosilicate glass (BPSG), an oxide layer obtained by performing a high density plasma-chemical vapor deposition (HDP-CVD) method, spin-on-glass (SOG), and a combination thereof.

5. The method according to claim 1, wherein the hard mask of the electrode patterns includes one selected from a group consisting of silicon nitride (Si₃N₄), silicon rich oxynitride, silicon oxynitride (SiON), and a combination thereof.

6. The method according to claim 1, wherein the mask pattern is used for forming a self-aligned contact (SAC), and includes one selected from a group consisting of a nitride-based material, polysilicon, a carbon-based polymer, and a combination thereof.

7. The method according to claim 1, wherein planarizing the insulation layer comprises performing a chemical mechanical polishing process.

* * * * *